United States Patent
Bi et al.

(10) Patent No.: US 9,748,381 B1
(45) Date of Patent: Aug. 29, 2017

(54) PILLAR FORMATION FOR HEAT DISSIPATION AND ISOLATION IN VERTICAL FIELD EFFECT TRANSISTORS

(71) Applicant: International Business Machines Corporation, Armonk, NY (US)

(72) Inventors: Zhenxing Bi, Niskayuna, NY (US); Kangguo Cheng, Schenectady, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/290,146

(22) Filed: Oct. 11, 2016

(51) Int. Cl.
| | |
|---|---|
| *H01L 21/336* | (2006.01) |
| *H01L 27/108* | (2006.01) |
| *H01L 29/76* | (2006.01) |
| *H01L 29/78* | (2006.01) |
| *H01L 29/66* | (2006.01) |
| *H01L 21/02* | (2006.01) |
| *H01L 27/088* | (2006.01) |
| *H01L 29/06* | (2006.01) |
| *H01L 23/367* | (2006.01) |
| *H01L 23/373* | (2006.01) |

(52) U.S. Cl.
CPC .... *H01L 29/7827* (2013.01); *H01L 21/02118* (2013.01); *H01L 23/367* (2013.01); *H01L 23/3737* (2013.01); *H01L 27/088* (2013.01); *H01L 29/0649* (2013.01); *H01L 29/66666* (2013.01)

(58) Field of Classification Search
CPC .......... H01L 29/66712; H01L 29/7802; H01L 29/7827; H01L 23/3737; H01L 21/02118; H01L 27/088; H01L 29/66666
See application file for complete search history.

(56) References Cited

U.S. PATENT DOCUMENTS

| | | | |
|---|---|---|---|
| 5,198,889 A | 3/1993 | Hisano et al. | |
| 6,268,621 B1 * | 7/2001 | Emmi | H01L 21/84 257/302 |
| 6,570,208 B2 | 5/2003 | Mandelman et al. | |
| 6,960,507 B2 | 11/2005 | Kim et al. | |

(Continued)

FOREIGN PATENT DOCUMENTS

| | | |
|---|---|---|
| KR | 20020022930 A | 3/2002 |
| KR | 20060076539 A | 7/2006 |

*Primary Examiner* — Benjamin Sandvik
*Assistant Examiner* — Damon Hillman
(74) *Attorney, Agent, or Firm* — Cantor Colburn LLP

(57) ABSTRACT

A method of fabricating a vertical field effect transistor includes forming fins from a portion of a substrate. At least a first fin of the fins is associated with a first device, at least a second fin of the fins is associated with a second device. The method includes forming alternating pillars of a first polymer and a second polymer on the substrate, removing the pillars of the second polymer except between two or more fins of a same device, and forming the substrate pillars below the pillars of the first polymer. The etching creates a deep trench between the first fin and the second fin. Removing the pillars of the first polymer and any remaining ones of the pillars of the second polymer is followed by performing an oxide fill to fill the deep trench and gaps between the pillars of the substrate with oxide.

20 Claims, 15 Drawing Sheets

(56) References Cited

U.S. PATENT DOCUMENTS

| | | |
|---|---|---|
| 7,271,034 B2 | 9/2007 | Brunschwiler et al. |
| 7,713,789 B2 | 5/2010 | Brunschwiler et al. |
| 7,928,565 B2 | 4/2011 | Brunschwiler et al. |
| 8,106,505 B2 | 1/2012 | Bernstein et al. |
| 8,324,058 B2 | 12/2012 | Cheng et al. |
| 9,054,215 B2 | 6/2015 | Nyhus et al. |
| 9,252,072 B2 | 2/2016 | Bernstein et al. |
| 9,269,630 B2 | 2/2016 | Nyhus et al. |
| 2008/0179664 A1 | 7/2008 | Rao |
| 2012/0052640 A1* | 3/2012 | Fischer ........... H01L 21/823425 438/268 |
| 2016/0071930 A1 | 3/2016 | Bentley et al. |
| 2016/0133724 A1 | 5/2016 | Nyhus et al. |

\* cited by examiner

PILLAR FORMATION FOR HEAT DISSIPATION AND ISOLATION IN VERTICAL FIELD EFFECT TRANSISTORS

BACKGROUND

The present invention relates to fabrication methods and resulting structures of a field effect transistor (FET), and more specifically, to forming pillars for heat dissipation and isolation in vertical FETs (VFETs).

A FET is a three-terminal device that includes a source, drain, and gate. Generally, a FET is fabricated with the source and drain formed on the same lateral level such that current flow, which is controlled by the gate in the channel region between the source and drain regions, is horizontal. In the efforts to scale complementary metal-oxide semiconductor (CMOS) technologies to 5 nanometers and below, non-planar FET architectures such as fin-type FETs (finFETs) and vertical FETs (VFETs) have been pursued. In a finFET, the source, drain and channel regions are built as a three-dimensional fin, which serves as the body of the device. The gate electrode is wrapped over the top and sides of the fin, and the portion of the fin that is under the gate electrode functions as the channel. In a VFET, the channel is also formed in a three-dimensional fin. However, the gate in a VFET extends along and/or around the vertical sidewalls of the fin. As a result, current flow in the channel region is vertical rather than horizontal.

SUMMARY

According to an embodiment of the present invention, a method of fabricating a vertical field effect transistor (VFET) includes forming fins from a portion of a substrate. At least a first fin of the fins is associated with a first device, at least a second fin of the fins is associated with a second device, and the first fin and the second fin are adjacent fins. Alternating pillars of a first polymer and a second polymer are formed on the substrate, adjacent to and between the fins. The pillars of the second polymer are removed, except between two or more fins of a same device. The substrate pillars are formed below the pillars of the first polymer based on etching, to a specified depth, the substrate below the pillars of the second polymer that are removed. The etching creates a deep trench between the first fin and the second fin. The method also includes removing the pillars of the first polymer and any remaining ones of the pillars of the second polymer, and performing an insulator fill to fill the deep trench and gaps between the pillars of the substrate with an insulator.

According to another embodiment, a structure of a vertical field effect transistor (VFET) includes a substrate layer of a substrate material, and the substrate pillars formed from the substrate material above the substrate layer. An insulator fill is between the pillars. Fins are formed above the terminal regions. Each of the terminal regions is bordered by one of the pillars. Gate regions are formed adjacent to the fins.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-15 show cross-sectional views of intermediate structures formed during the fabrication of VFET devices according to one or more embodiments, in which:

FIG. 1 is a cross-sectional view showing fin hard masks formed on a substrate;

FIG. 2 is a cross-sectional view of the intermediate structure that results from removal of the fin hard mask from non-fin regions;

FIG. 3 shows the result of fin formation and, specifically, a pair fins specific to each of two devices;

FIG. 4 is a cross-sectional view of an intermediate structure that results from deposition of a co-polymer;

FIG. 5 is the structure that results from an anneal of the structure shown in FIG. 4;

FIG. 6 is a cross-sectional view showing the structure of FIG. 5 with a mask formed above the second co-polymer material between fins of each device;

FIG. 7 results from a selective removal of the second co-polymer material in the structure of FIG. 6;

FIG. 8 is a cross-sectional view of an intermediate structure that results from removal of the mask and first and second co-polymer materials;

FIG. 9 is a cross-sectional view of an intermediate structure that includes an oxide fill;

FIG. 10 results from a recess of the oxide to the level of the pillars formed from the substrate material;

FIG. 11 is a cross-sectional view of an intermediate structure that includes a bottom spacer;

FIG. 12 is an intermediate structure that includes a conformal high-k dielectric and a gate metal;

FIG. 13 is a cross-sectional view of an intermediate structure that includes a top spacer above the gate metal;

FIG. 14 results from deposition of an oxide layer above the top spacer shown in FIG. 13; and FIG. 15 is a cross-sectional view of an intermediate structure that includes epitaxial layers that replace the fin hard masks above the fins.

DETAILED DESCRIPTION

As previously noted, several non-planar FET architectures, such as finFETs and VFETs, have fin-shaped channel regions between the source and drain regions. The gate that controls the channel region is formed around or between the fins. This gate region can become hot during operation of the transistor. Heat dissipation from the gate region can be challenging when the gate is formed on an oxide, as is typically the case. This is because oxide is not an efficient heat transfer material. In addition, when transistor devices are formed adjacent to each other, proper electrical isolation of the devices is necessary. On the one hand, the decrease in pitch between devices can increase the number of devices that are fabricated. On the other hand, precise formation of a shallow trench isolation (STI) region that is sufficiently deep to provide isolation between devices becomes more challenging as the devices are formed closer to each other.

Turning now to an overview of aspects of the present invention, one or more embodiments provide fabrication methods for VFETs in which an oxide is interspersed with the substrate material. Specifically, instead of a complete trench formed in the non-fin regions as in known FETs, pillars are formed from the substrate material. These pillars act to transfer heat from the gate region. In addition, the bi-polymer structure used to form the pillars facilitates an increase in the process window for forming the trench between devices.

Figure 1:
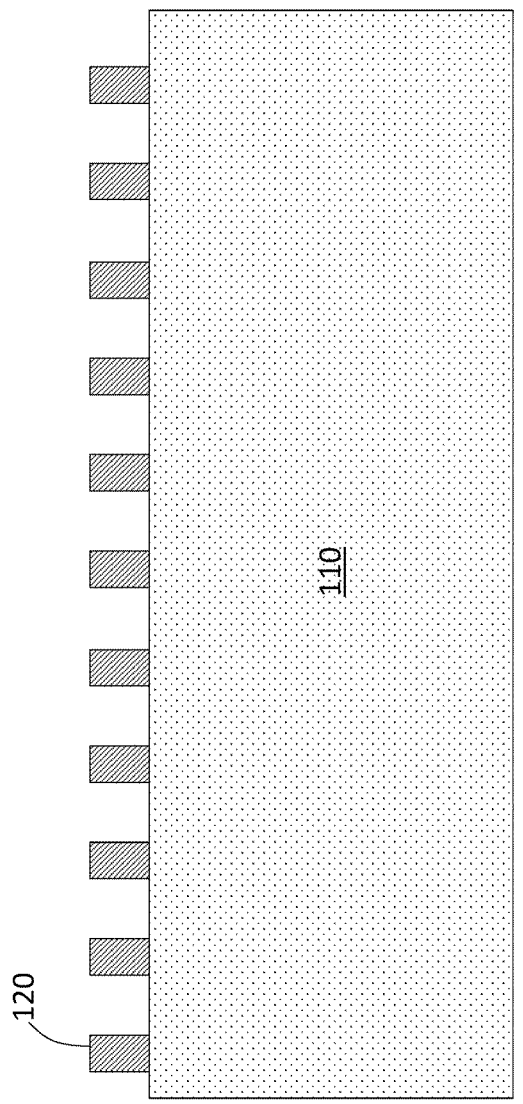

Turning now to a more detailed description of one or more embodiments, FIGS. 1-15 show cross-sectional views of intermediate structures formed during the fabrication of VFET devices. The cross-sectional views show one side of the fin region for explanatory purposes to detail the relevant features. It should be clear that another non-fin region is formed, similarly to the one that is detailed, on the other side of the devices shown in the figures. FIG. 1 shows fin hard masks 120 formed on a substrate 110. The patterning of a hardmask layer into the fin hardmasks 120, as shown, is achieved through known processes such as, for example, a reactive ion etch (ME), self-aligned double patterning (SADP), or side-wall assisted double patterning (self-aligned quadruple patterning (SAQP)) process and is not further detailed here.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also include an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the semiconductor substrate 110 can also include a hybrid oriented (HOT) semiconductor substrate in which the HOT substrate has surface regions of different crystallographic orientation. The semiconductor substrate 110 can be doped, undoped, or contain doped regions and undoped regions therein. The semiconductor substrate 110 can include regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as STI, fins, nanowires, nanosheets, resistors, capacitors, etc. The formation of the intermediate structure shown in FIG. 1 is known and not further detailed herein.

Figure 2:
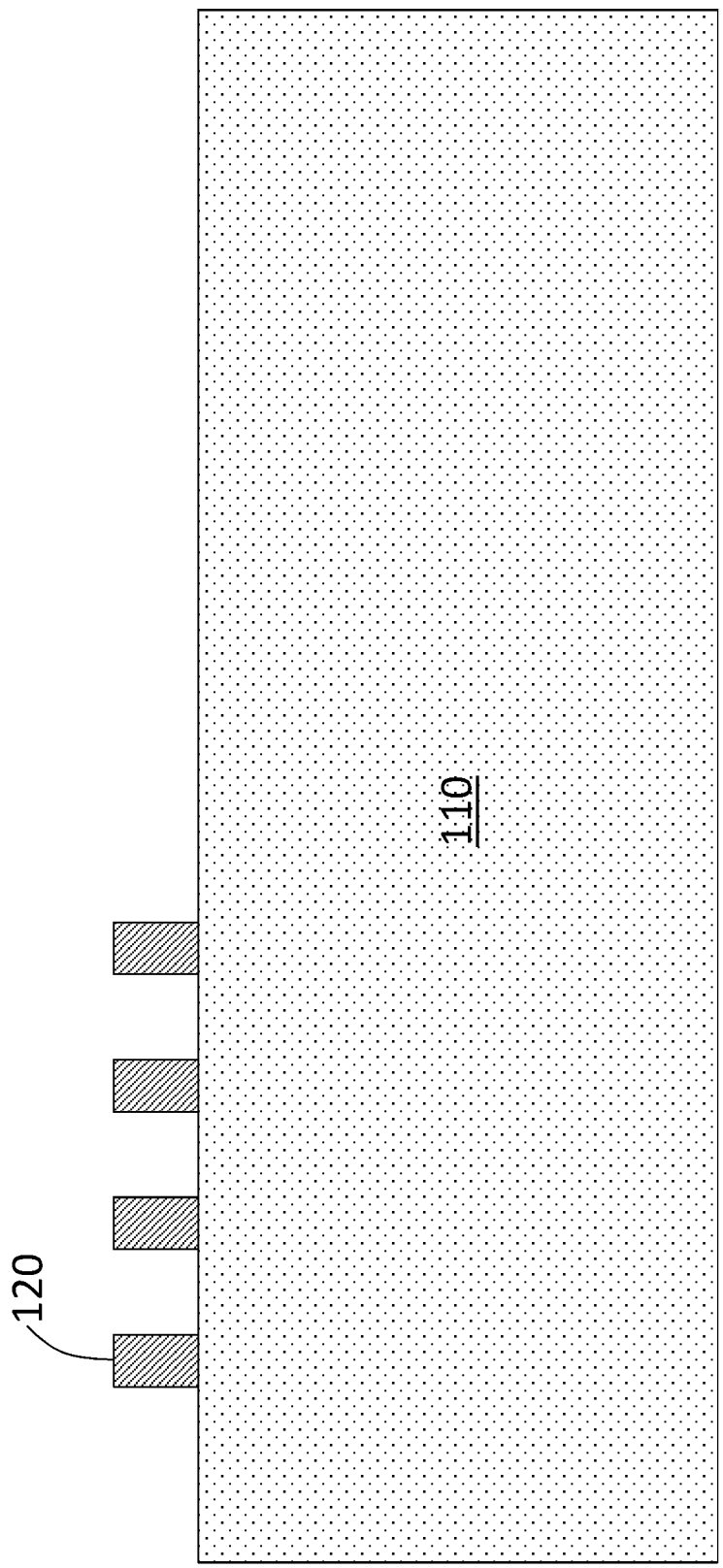
Figure 3:
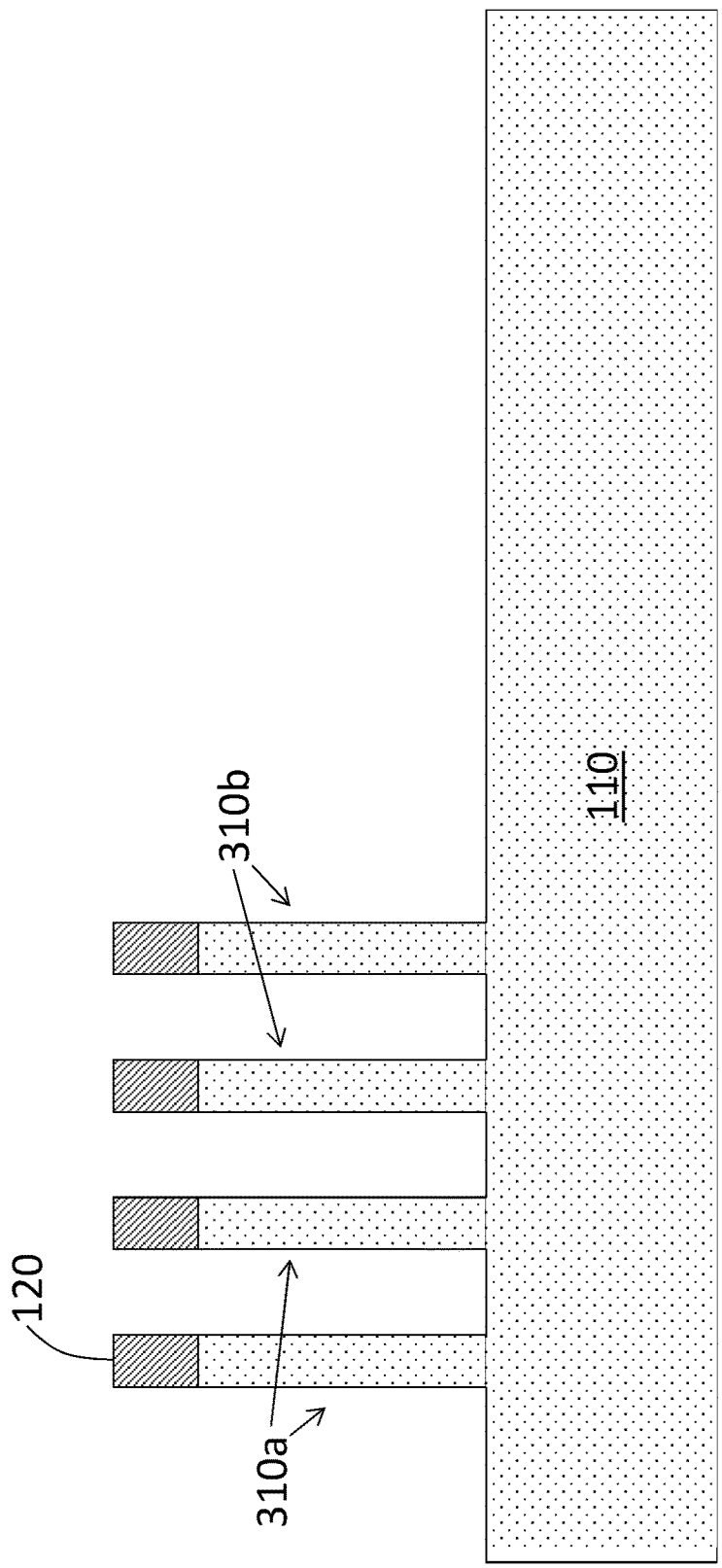

FIG. 2 is a cross-sectional view of the intermediate structure that results from removal of the fin hard mask 120 from non-fin regions. This is followed by formation of the fins 310a, 310b (generally 310), as shown in FIG. 3. The designation of fins 310a and fins 310b is used to indicate that the two fins 310a are part of one VFET, and the two fins 310b are part of another VFET. This designation is further discussed with reference to FIG. 6. Fin 310 formation results from etching the substrate 110 using an etch process such as a RIE process, for example, while using the fin hard masks 120 to pattern the fins 310.

Figure 4:
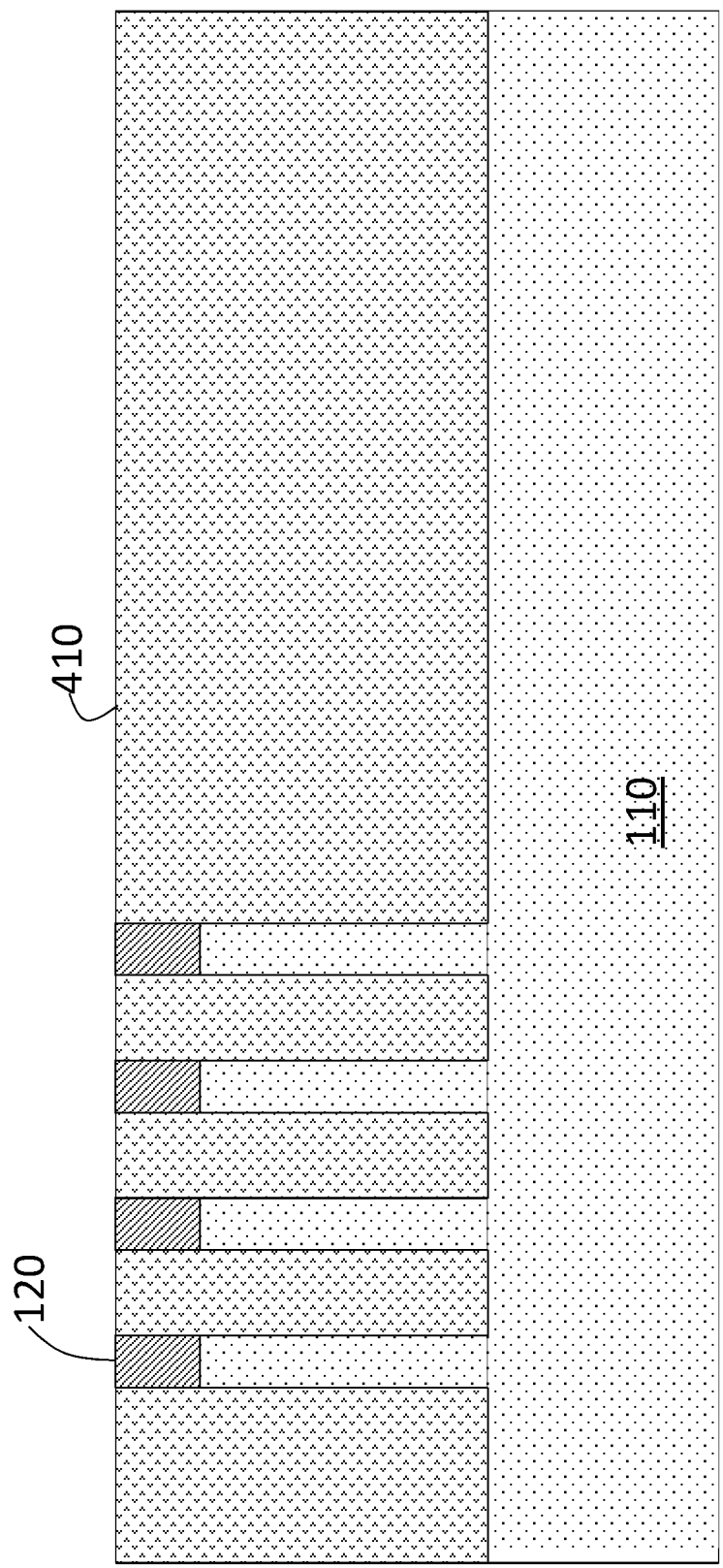
Figure 5:
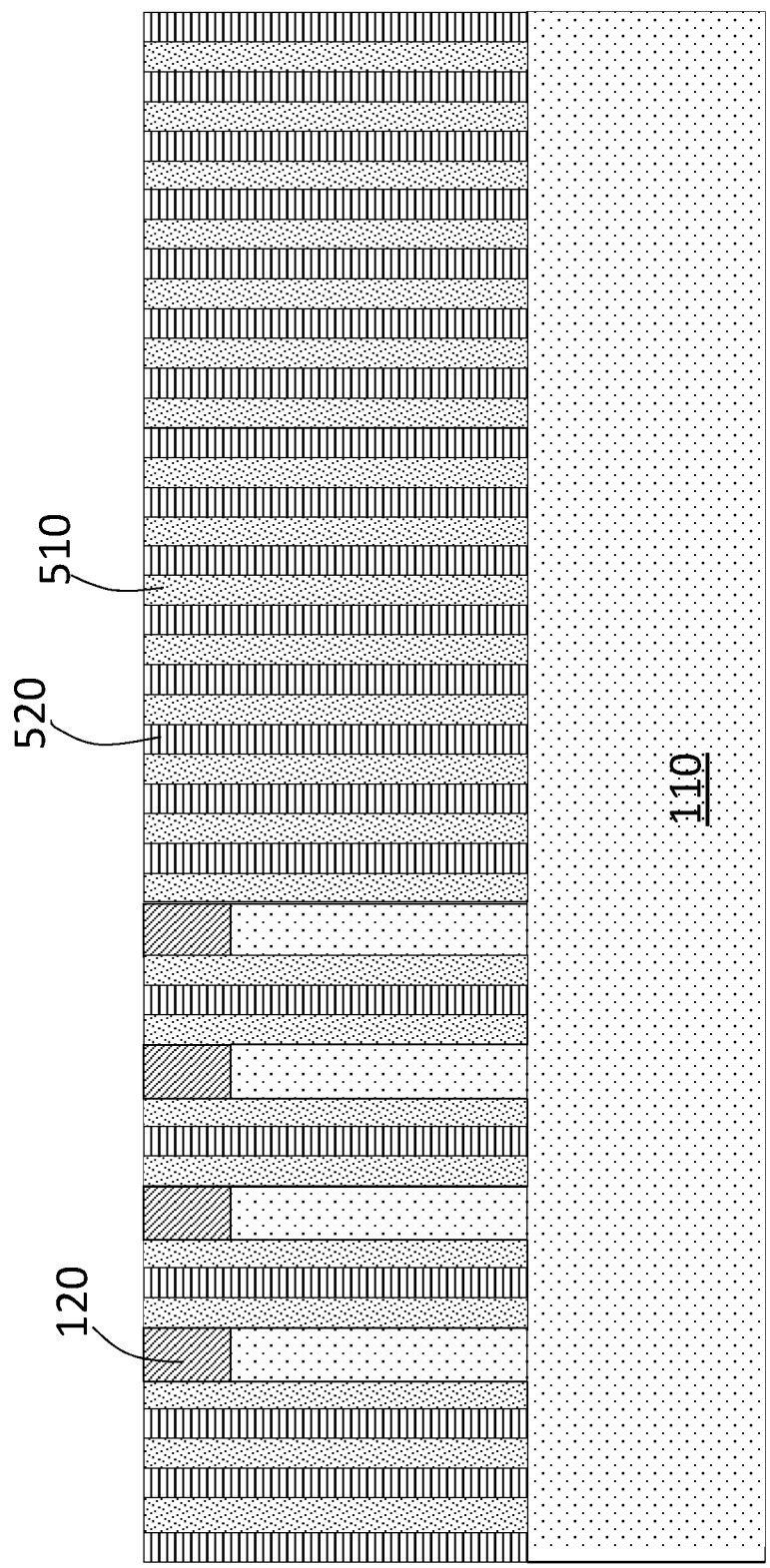

FIG. 4 is a cross-sectional view of an intermediate structure that results from deposition of a co-polymer 410 for directed self-assembly (DSA). The co-polymer 410 can be different molecular weights and ratios of polystyrene (PS)-poly(methyl methacrylate) (PMMA), for example. The molecular weight and ratio of PMMA and PS can be selected based on the desired pitch of the first co-polymer material 510 (FIG. 5) and the second co-polymer material 520 (FIG. 5). The deposition of the co-polymer 410 can be followed by a planarization such as a chemical mechanical planarization (CMP) to make the co-polymer 410 level with the fin hard masks 120, as shown in FIG. 4.

FIG. 5 is the structure that results from an anneal of the structure shown in FIG. 4. The co-polymer 410 separates into a bi-polymer including a first co-polymer material 510 (e.g., PS, PMMA) and a second co-polymer material 520 (e.g., PMMA, PS) based on the anneal process. As FIG. 5 indicates, the first co-polymer material 510 and the second co-polymer material 520 are separated into alternating pillars.

Figure 6:
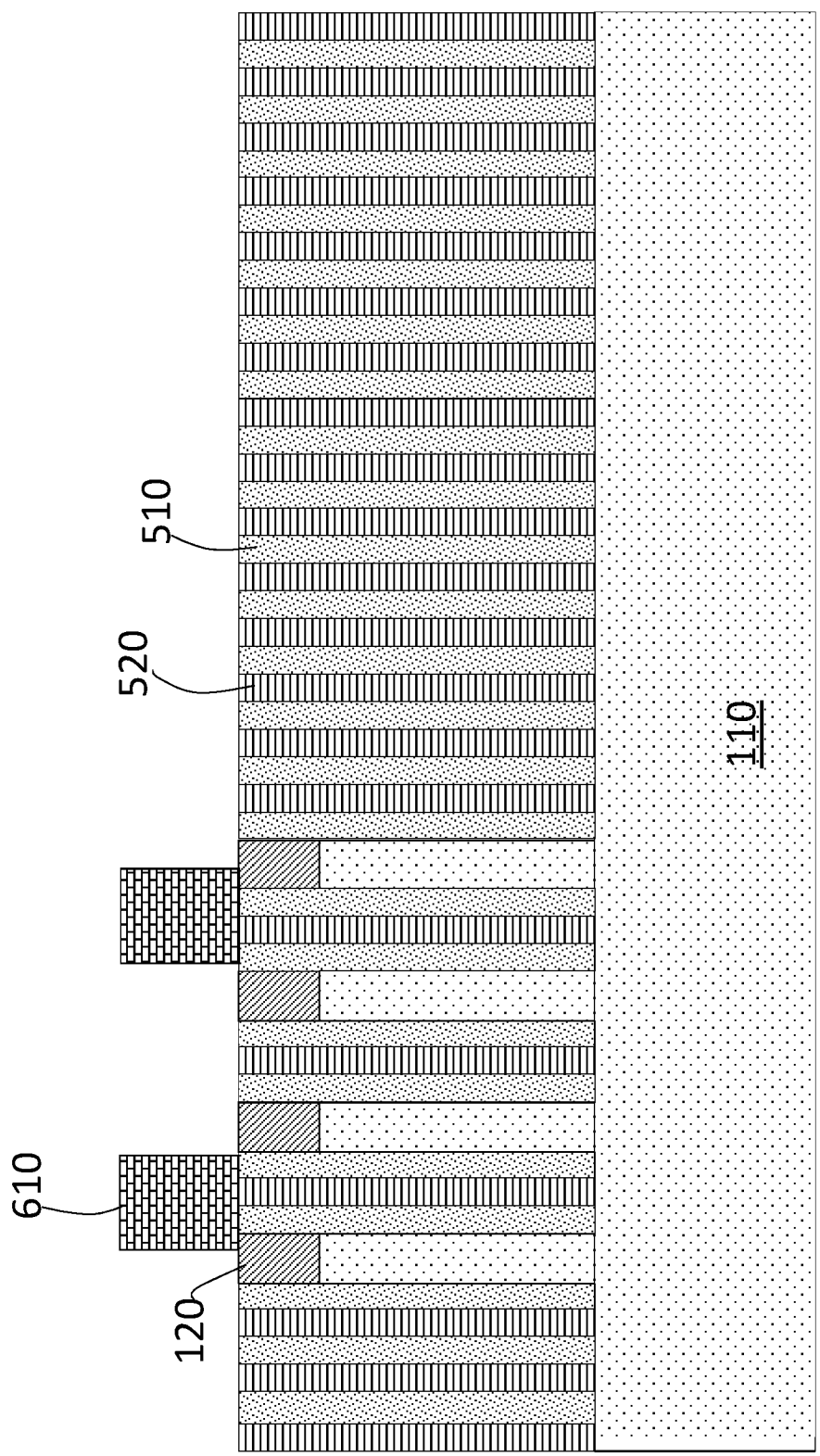

A mask 610 is deposited and patterned to form the intermediate structure shown in FIG. 6. The mask 610 can be a photoresist and is formed above the second co-polymer material 520 between fins 310a of one device and between fins 310b of another device. That is, only the second co-polymer material 520 between fins 310 of the same device needs to be protected by each mask 610.

Figure 7:
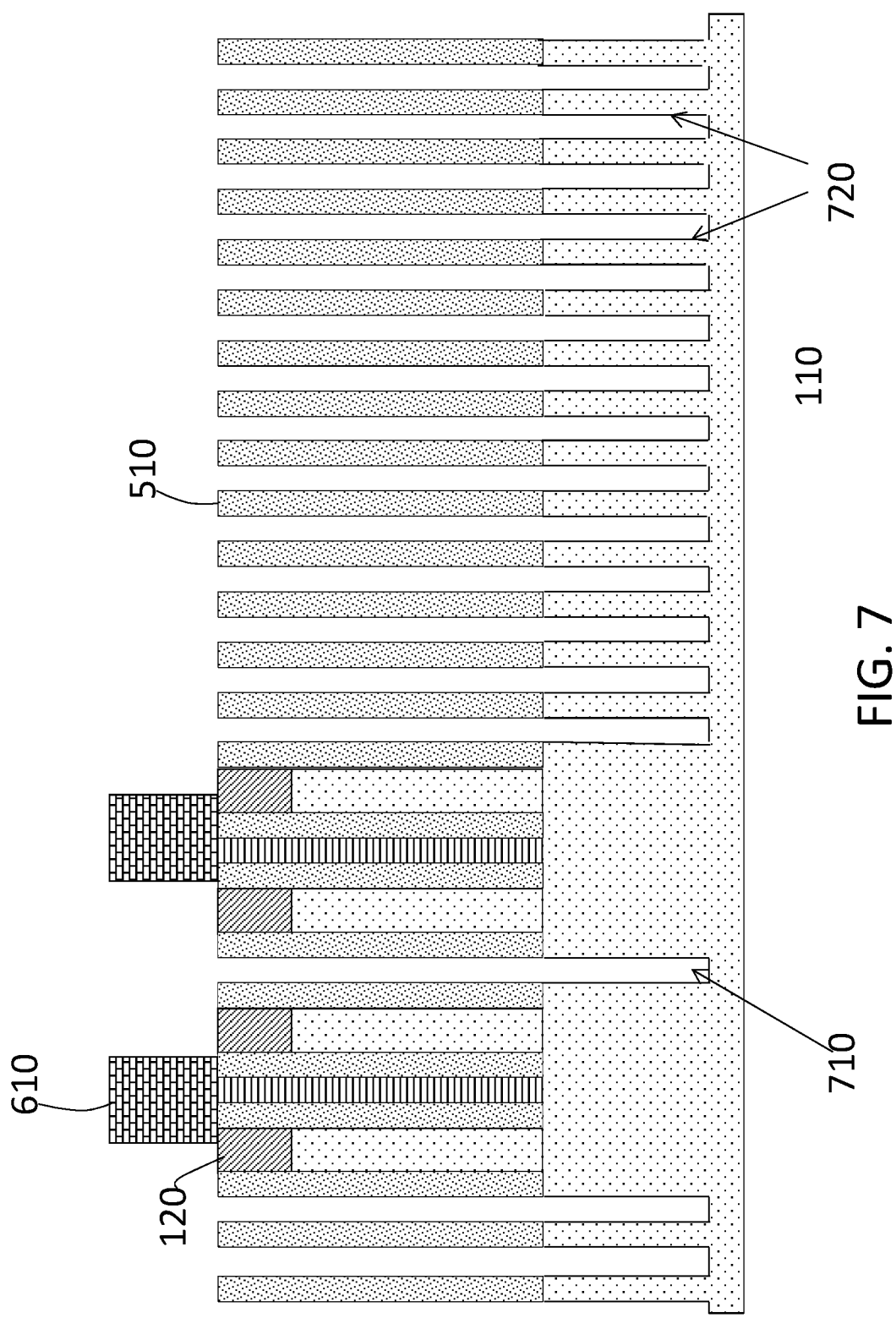

A selective removal of the second co-polymer material 520 is then done to form the intermediate structure shown in FIG. 7. Only the second co-polymer material 520 under the masks 610 is retained at this stage. The etch goes through to a portion of the substrate 110 below the second co-polymer material 520 that is removed, as shown. As FIG. 7 indicates, one consequence of the selective removal is the formation of a deep trench 710 between the two devices. The width of the deep trench 710 is defined by the thickness of the second co-polymer material 520. That is, the pitch of the second co-polymer material 520 must be less than the fin 310 pitch. Another consequence of the selective removal of the second co-polymer material 520 and substrate 110 below is the formation of pillars 720 from the substrate 110, as shown in FIG. 7.

Figure 8:
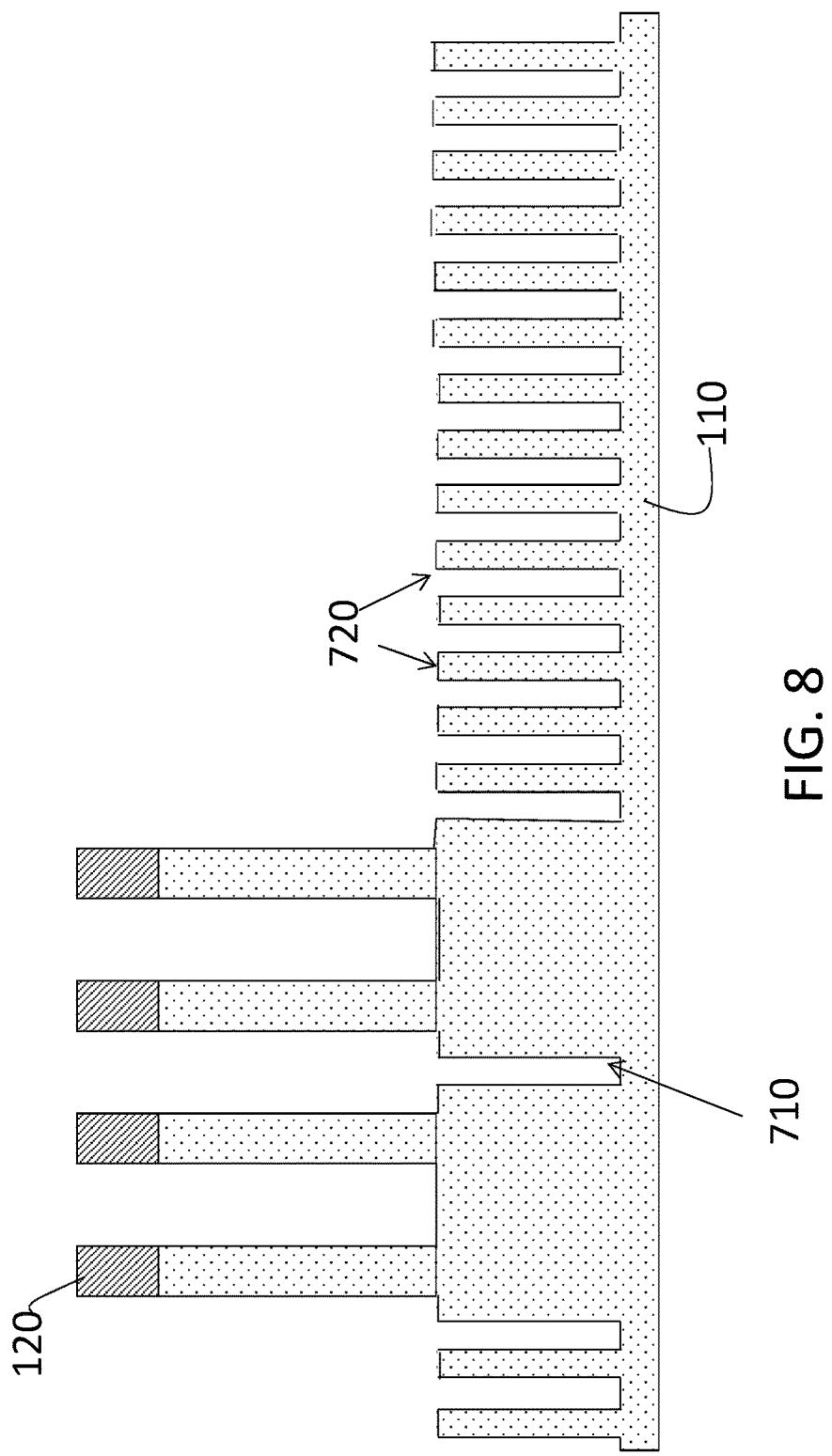

Additional RIE processing is performed on the intermediate structure shown in FIG. 7 to result in the structure shown in FIG. 8. There can be multiple etching processes that are not shown in stages. For example, the masks 610 are removed to then remove the remaining second co-polymer material 520. The first co-polymer material 510 is also removed. This can be accomplished by a further RIE process or a wet etch process, for example.

Figure 9:
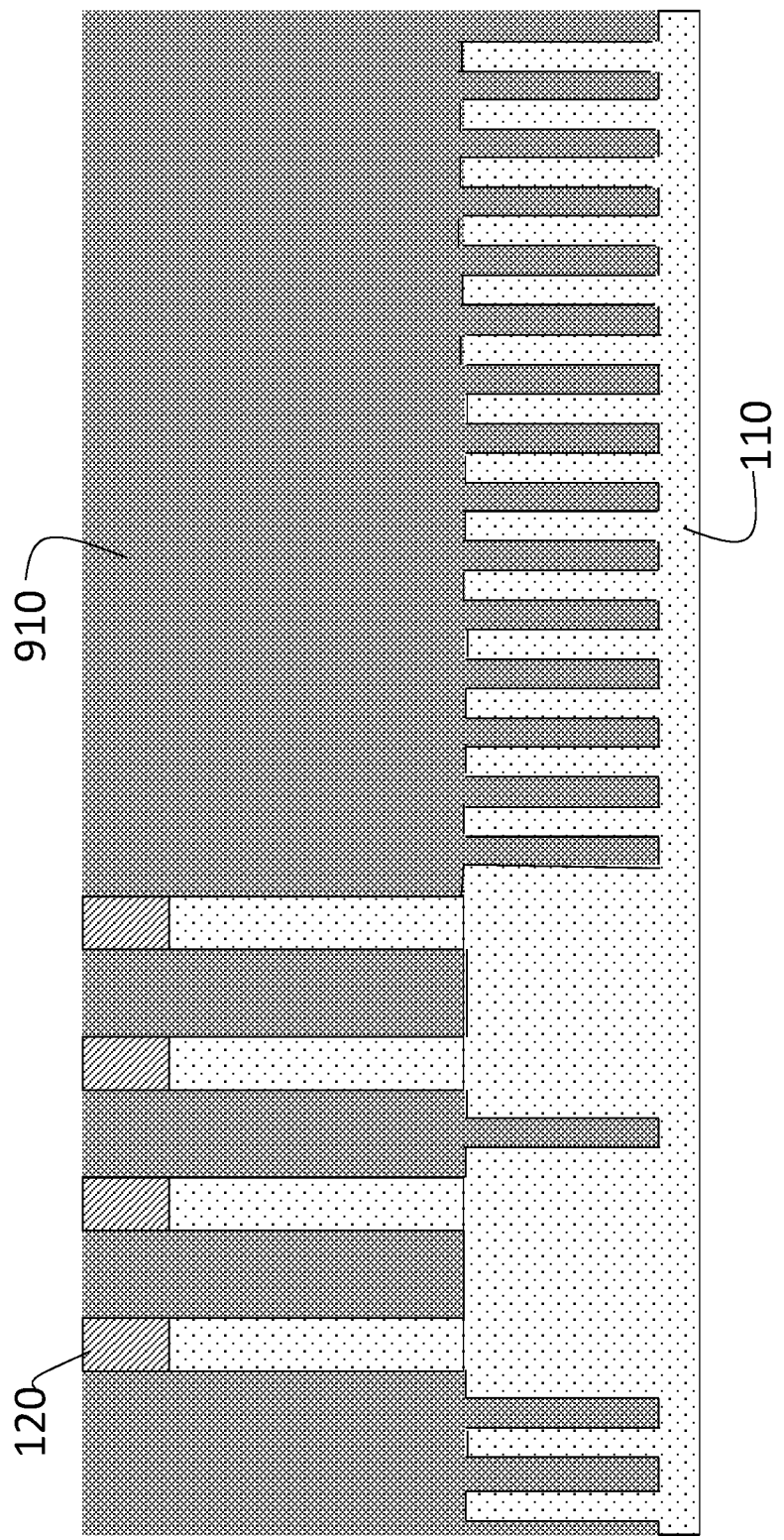
Figure 10:
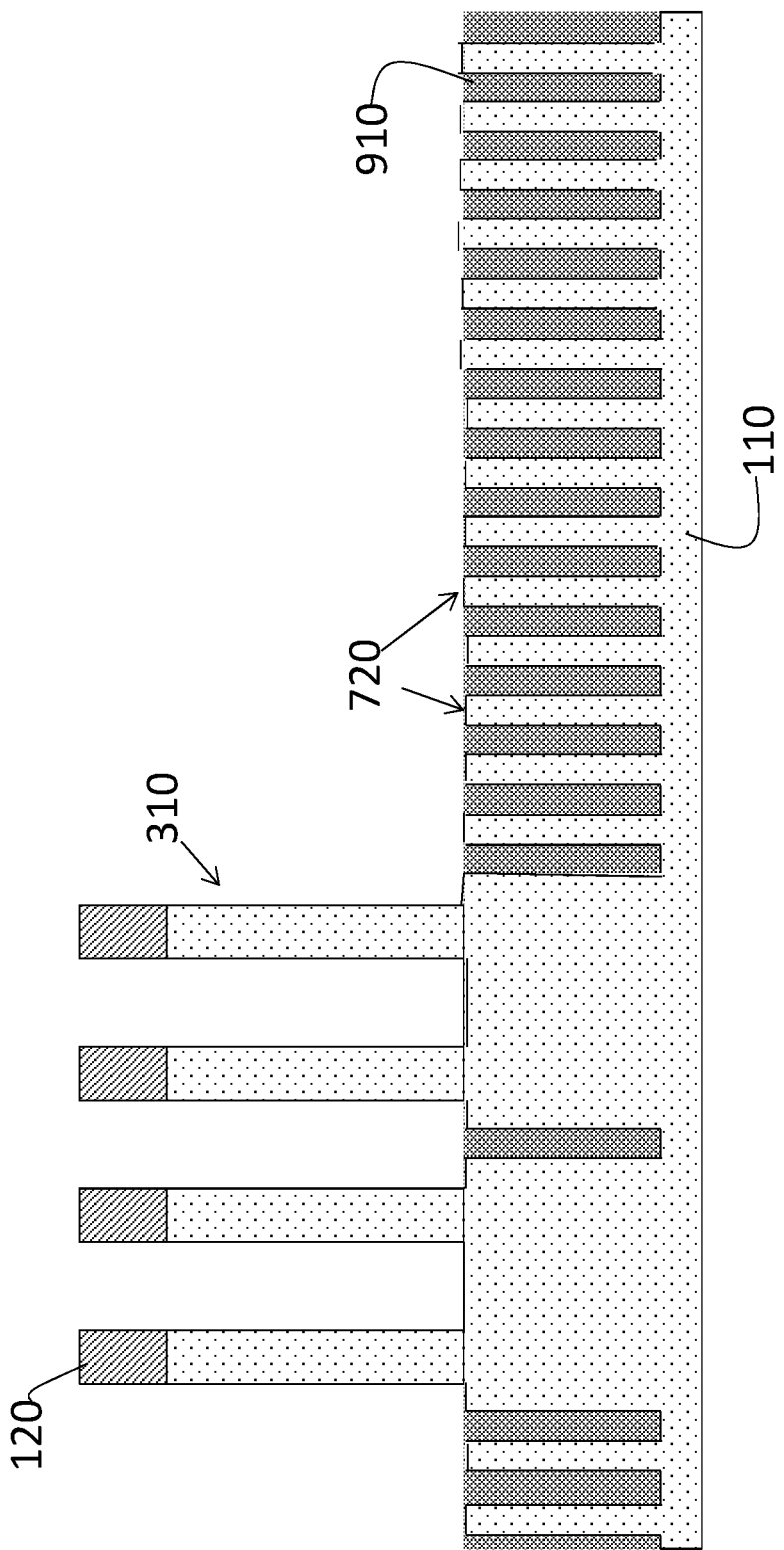

FIG. 9 is a cross-sectional view of an intermediate structure that includes an insulation material 910 fill. The insulation material 910 can be an oxide or nitride, for example. A CMP process can be performed following deposition of the insulation material 910 to make the insulation material 910 level with the fin hard masks 120. A recess of the insulation material 910 is then performed to result in the intermediate structure shown in FIG. 10. The pillars 720 formed from the substrate 110 can act as an embedded endpoint during the recess to indicate the level at which the insulation material 910 should be left. The insulation material 910 in the trench 710 acts to electrically isolate the two transistor devices from each other. Based on the thickness of the second co-polymer material 520, this isolation region can be made as narrow as needed. At this stage, known processes are performed to complete the fabrication FETs. Some of these processes are outlined with reference to FIGS. 11-15 according to one or more embodiments related to VFETs.

Figure 11:
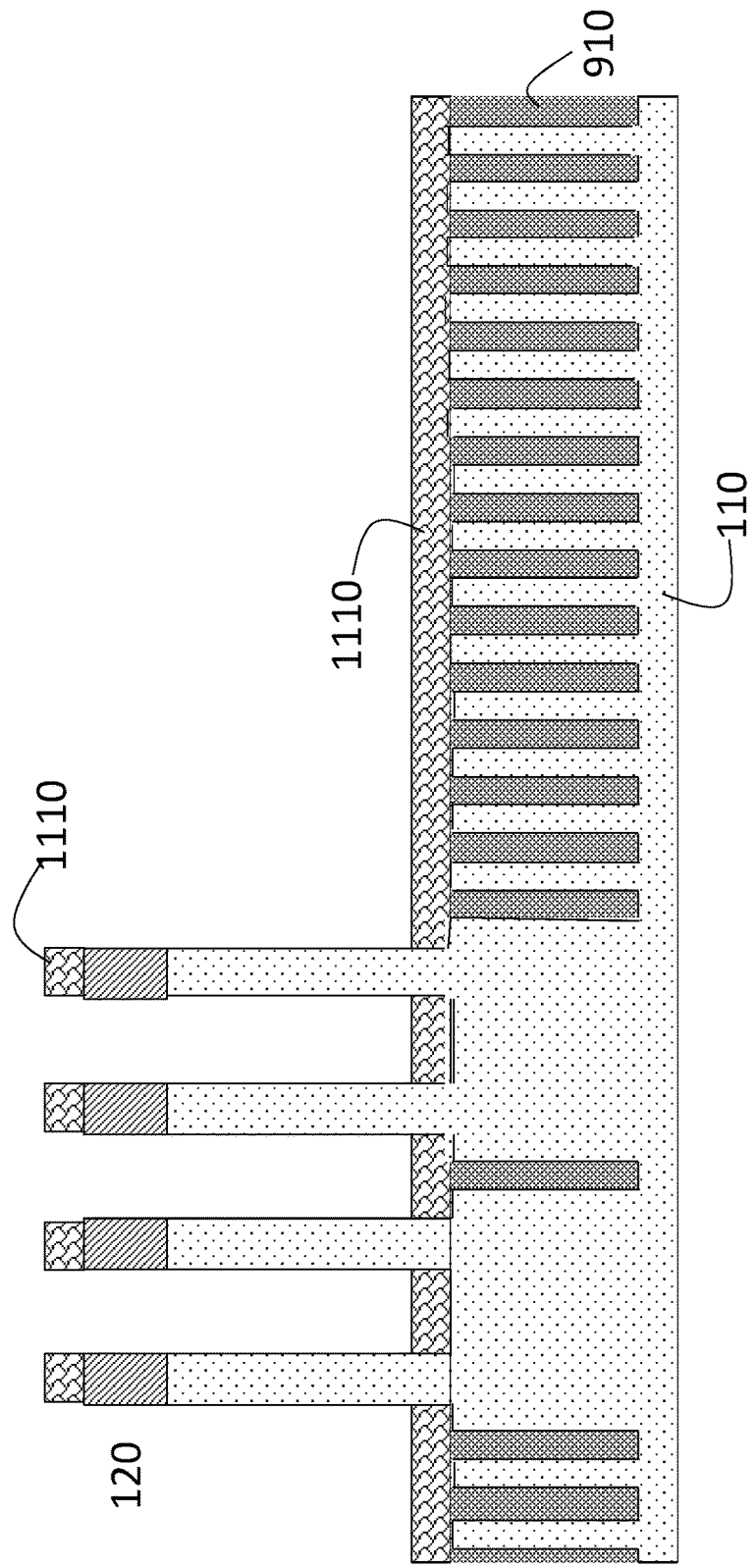
Figure 12:
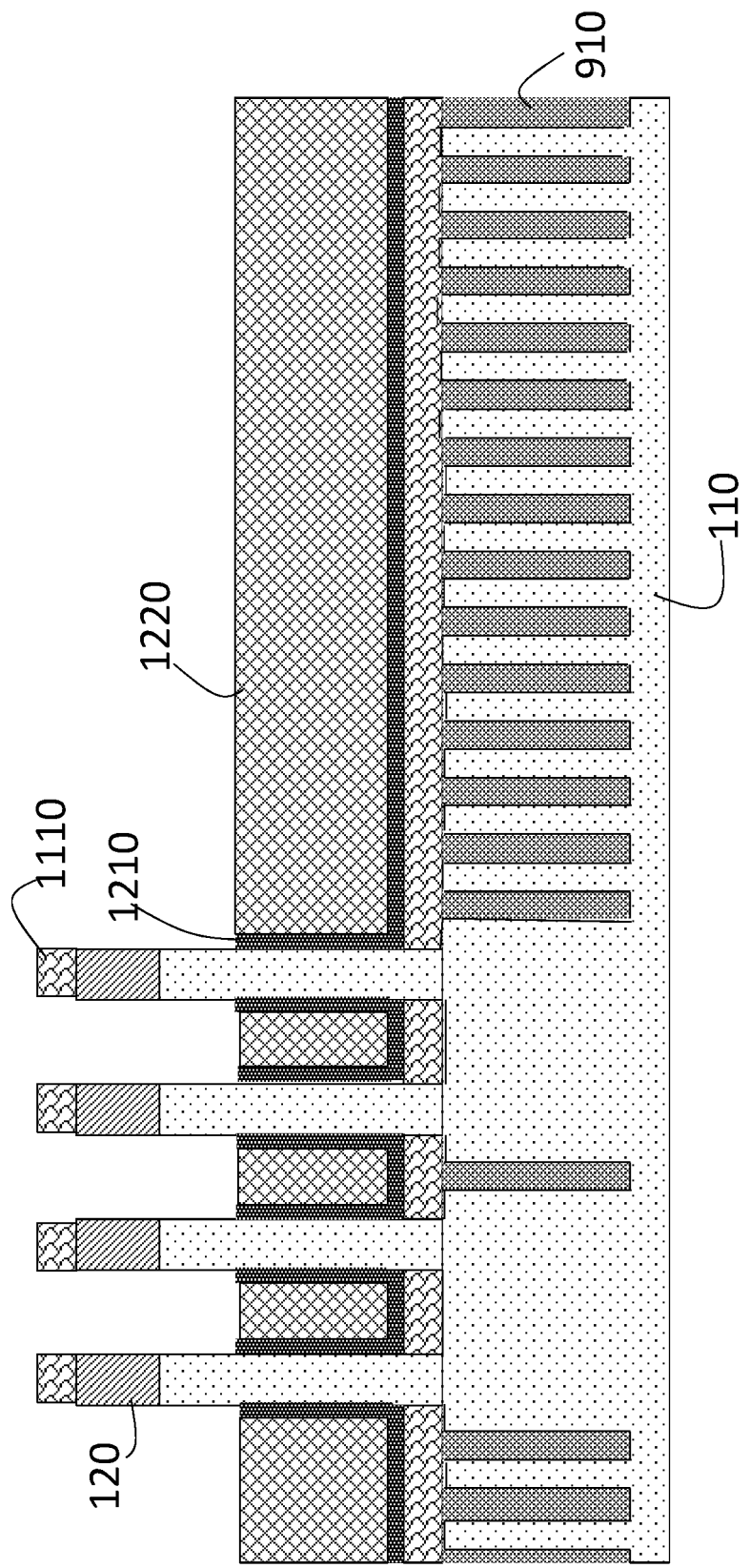
Figure 13:
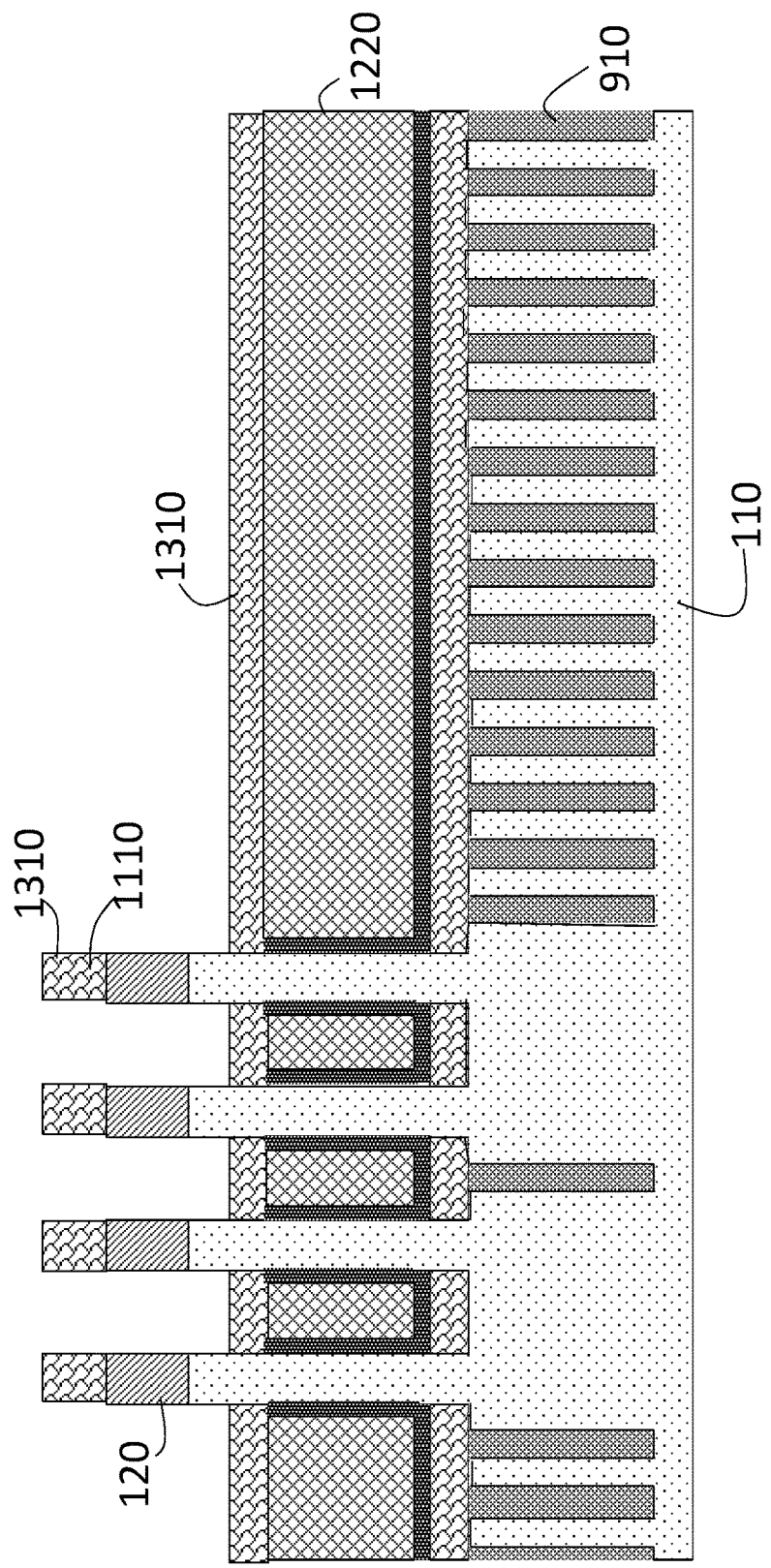
Figure 14:
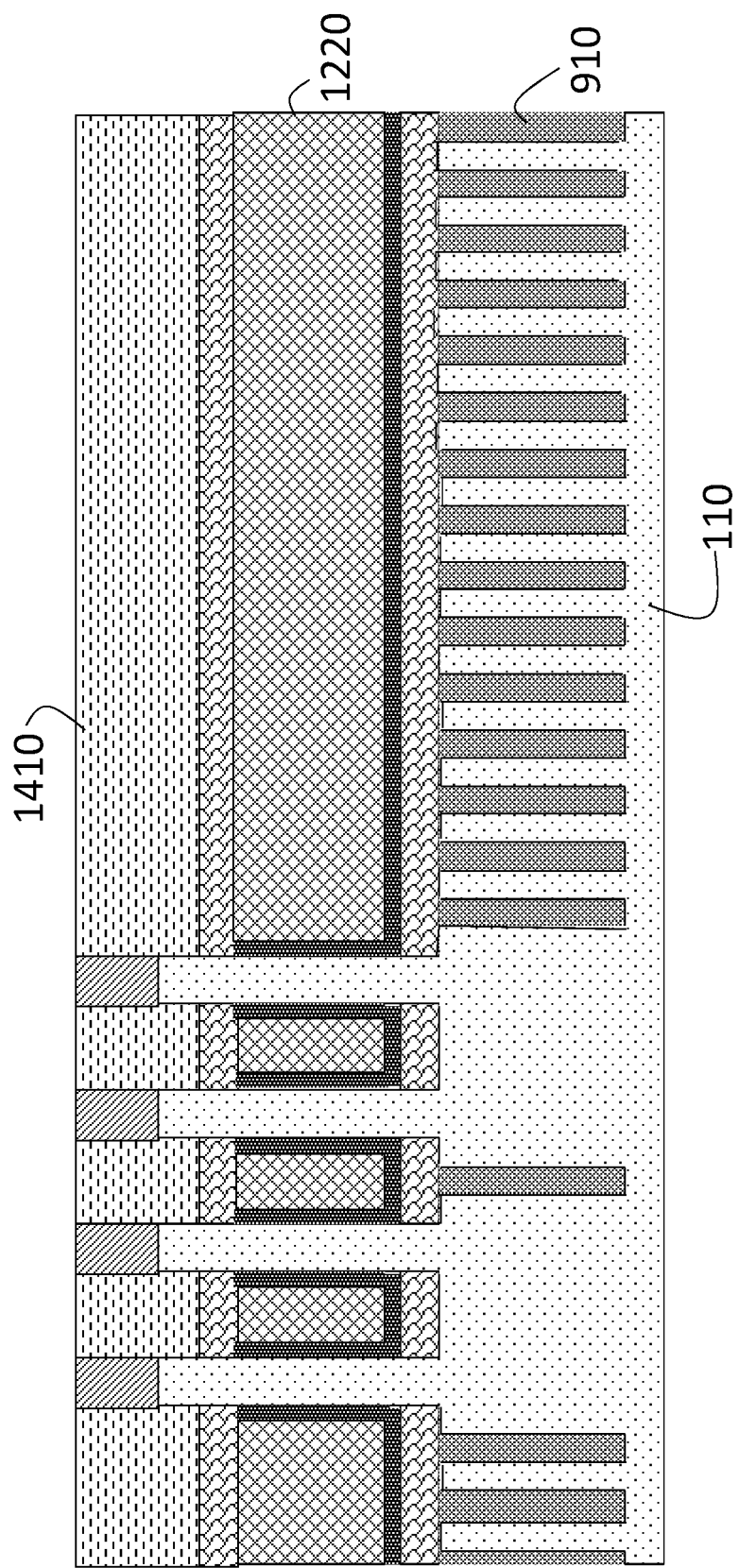
Figure 15:
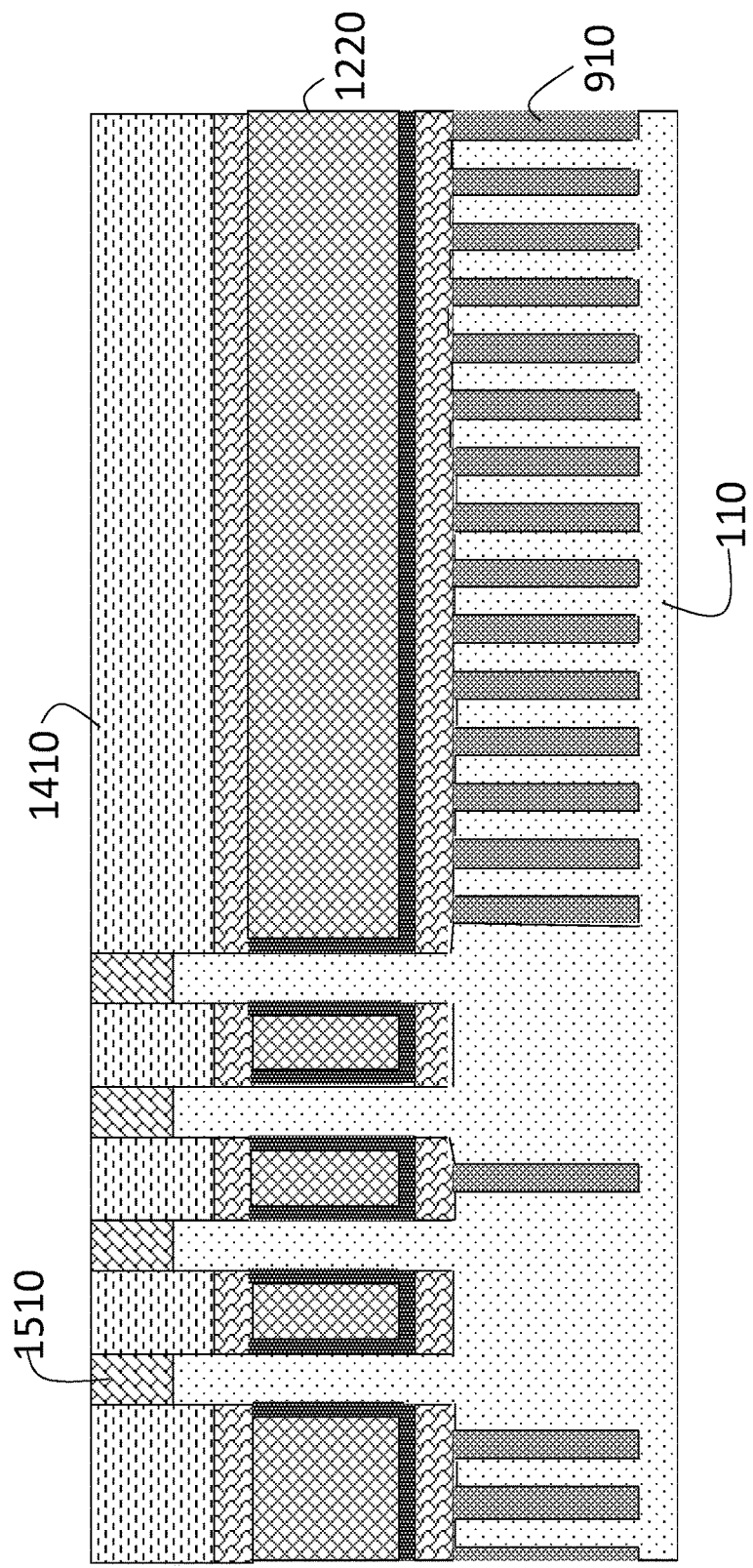

FIG. 11 is a cross-sectional view of an intermediate structure that includes a bottom spacer 1110. The bottom spacer 1110 is formed by a directional deposition process and can be, for example, silicon boron carbide nitride (SiBCN). FIG. 12 shows the result of depositing and recessing a high-k dielectric 1210 and gate metal 1220. The high-k dielectric 1210 can be hafnium dioxide (HfO2), for example, and exemplary gate metals 1220 include titanium nitride (TiN), titanium carbide (TiC), and tungsten (W). The high-k dielectric 1210 is deposited conformally. This process is followed by formation of a top spacer 1310. The top spacer 1310 and bottom spacer 1110 can be the same material, as shown in FIG. 13, or can be different materials according to alternate embodiments. The intermediate structure shown in FIG. 14 includes an oxide layer 1410 deposited over the top spacer 1310. The material of this oxide layer 1410 can be different from the insulation material 910. The deposition can be followed by a CMP process to result in the structure of FIG. 14. In FIG. 15, the cross-sectional view is of an intermediate structure that results from removal of the fin hard masks 120 and growth of an epitaxial layer 1510 in the place of each fin hard mask 120. These epitaxial layers 1510 represent the drain regions of the devices according to an embodiment. According to alternate embodiments in which the drain region is formed below the fins 310, source regions can be formed above the top spacer 1310. Doping of the substrate 110 below the fins results in the source or drain region being formed. As FIG. 15 makes clear, one of the terminal regions (source or drain) is formed below the fins 310 while another of the terminal regions (drain or source) is formed above the fins 310. Accordingly, current flow along the fins is vertical.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop. The terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A method of fabricating a vertical field effect transistor (VFET), the method comprising:
    forming fins from a portion of a substrate, wherein at least a first fin of the fins is associated with a first device, at least a second fin of the fins is associated with a second device, and the first fin and the second fin are adjacent fins;
    forming alternating pillars of a first polymer and a second polymer on the substrate, adjacent to and between the fins;
    removing the pillars of the second polymer except between two or more fins of a same device;
    forming substrate pillars below the pillars of the first polymer based on etching, to a specified depth, the substrate below the pillars of the second polymer that are removed, wherein the etching creates a deep trench between the first fin and the second fin;
    removing the pillars of the first polymer and any remaining ones of the pillars of the second polymer; and
    performing an insulator fill to fill the deep trench and gaps between the pillars of the substrate with an insulator.

2. The method according to claim 1, wherein the forming the fins includes patterning hard masks on the substrate.

3. The method according to claim 2, wherein the forming the fins includes etching the portion of the substrate to leave only the fins below the hard masks.

4. The method according to claim 1, wherein the forming the alternating pillars includes depositing a co-polymer on the substrate adjacent to and between the fins.

5. The method according to claim 4, wherein the forming the alternating pillars includes annealing the co-polymer.

6. The method according to claim 4, wherein the depositing a co-polymer includes depositing polystyrene (PS)-poly(methyl methacrylate) (PMMA).

7. The method according to claim 1, further comprising forming a mask over the two or more fins of the same device to retain the pillars of the second polymer between the two or more fins of the same device during the removing the pillars of the second polymer.

8. The method according to claim 1, further comprising recessing the insulator after the performing the insulator fill based on using the pillars of the substrate as an endpoint detection layer.

9. The method according to claim 1, further comprising forming a bottom spacer above the substrate pillars.

10. The method according to claim 9, further comprising forming a gate above the bottom spacer.

11. The method according to claim 10, further comprising forming a top spacer above the gate.

12. A structure of a vertical field effect transistor (VFET), the structure comprising:
    a substrate layer comprising a substrate material;
    substrate pillars formed from the substrate material above the substrate layer;
    an insulator fill between the pillars;
    fins formed above terminal regions, wherein each of the terminal regions is bordered by one of the pillars; and
    gate regions formed adjacent to the fins and entirely above the pillars.

13. The structure according to claim 12, further comprising a bottom spacer above the pillars and the insulator fill.

14. The structure according to claim 13, further comprising a high k dielectric formed conformally above the bottom spacer, wherein the high k dielectric is also formed on sides of the fins.

15. The structure according to claim 14, further comprising a gate metal formed adjacent to each of the fins.

16. The structure according to claim 15, further comprising a top spacer formed above the gate metal.

17. The structure according to claim 16, further comprising an oxide layer above the top spacer.

18. The structure according to claim 12, further comprising an epitaxial layer above each of the fins, wherein the epitaxial layer represents an upper terminal.

19. The structure according to claim 18, wherein the terminal region is a source region, and the upper terminal is a drain.

20. The structure according to claim 18, wherein the terminal region is a drain region, and the upper terminal is a source.

* * * * *